United States Patent
Mayer et al.

(10) Patent No.: US 12,237,242 B2
(45) Date of Patent: Feb. 25, 2025

(54) SEMICONDUCTOR DEVICE PACKAGE COMPRISING A THERMAL INTERFACE MATERIAL WITH IMPROVED HANDLING PROPERTIES

(71) Applicant: Infineon Technologies Austria AG, Villach (AT)

(72) Inventors: Martin Mayer, Nittendorf (DE); Edward Fuergut, Dasing (DE); Alexander Roth, Zeitlarn (DE); Karina Rott, Munich (DE)

(73) Assignee: Infineon Technologies Austria AG, Villach (AT)

( * ) Notice: Subject to any disclaimer, the term of this patent is extended or adjusted under 35 U.S.C. 154(b) by 380 days.

(21) Appl. No.: 17/368,311

(22) Filed: Jul. 6, 2021

(65) Prior Publication Data

US 2022/0013433 A1    Jan. 13, 2022

(30) Foreign Application Priority Data

Jul. 9, 2020  (EP) .................................... 20185063

(51) Int. Cl.
*H01L 23/42*   (2006.01)
*H01L 23/31*   (2006.01)
*H01L 23/373*  (2006.01)

(52) U.S. Cl.
CPC .......... *H01L 23/42* (2013.01); *H01L 23/3121* (2013.01); *H01L 23/3735* (2013.01); *H01L 23/3736* (2013.01)

(58) Field of Classification Search
CPC . H01L 23/3737; H01L 23/42; H01L 23/3121; H01L 23/3735; H01L 23/3736; H01L 23/4334; H01L 2924/181; H01L 21/56; H01L 23/295
See application file for complete search history.

(56) References Cited

U.S. PATENT DOCUMENTS 5,672,548 A    9/1997 Culnane et al.
2017/0117208 A1  4/2017 Kasztelan et al.

FOREIGN PATENT DOCUMENTS

WO    2015056523 A1   4/2015

*Primary Examiner* — Tucker J Wright
(74) *Attorney, Agent, or Firm* — Murphy, Bilak & Homiller, PLLC

(57) ABSTRACT

A semiconductor device package comprises an electrically conductive carrier, a semiconductor die disposed on the carrier, an encapsulant encapsulating part of the carrier and the semiconductor die, an electrically insulating and thermally conductive interface structure, in particular covering an exposed surface portion of the carrier and a connected surface portion of the encapsulant, wherein the interface structure comprises a glass transition temperature in a range between −40° C. to 150° C.

16 Claims, 5 Drawing Sheets

SEMICONDUCTOR DEVICE PACKAGE COMPRISING A THERMAL INTERFACE MATERIAL WITH IMPROVED HANDLING PROPERTIES

TECHNICAL FIELD

The present disclosure relates to a semiconductor device package and a method for fabricating a semiconductor device package.

BACKGROUND

In the field of semiconductor packaging, in particular as regards power packages, a general problem is to reliably dissipate the heat generated in the semiconductor die to the outside. Very often a semiconductor die mounted on an electrical carrier is cast with an encapsulating compound and thereby a surface region of the electrical carrier is kept free. A thermal interface structure (TIM, thermal interface material), which electrically isolates the electrical carrier with respect to its surroundings, can then be mounted on one part of the encapsulation structure and the surface region of the electrical carrier. The user can then mount a heat dissipation element, for example in the form of a heat sink, on such a semiconductor device package, in order to be able to dissipate accumulated waste heat from the semiconductor device package to the periphery during the operation of the semiconductor device package. This can be advantageous in a number of different applications, e.g., EV charging, electromobility, renewable energy, home appliances, etc.

The operation performance of a semiconductor package is limited in general by the amount of heat, which can be transferred to a cooling unit such as a heat sink. Therefore, thermal interface materials (TIM) are used as interface material between the electrical carrier and the cooling unit. As regards TIM, different materials have been used in the past, among them, for example, thermal grease. However, these materials may lack sufficient electrical isolation and are often not reliable in the way that during operation cycles their thermomechanical stability can be affected. Furthermore, it may sometimes happen that dispensing of thermal grease is not properly performed leading to a possible thermal issue with the component. For example, an uneven dispensation of the thermal paste on a production line may be problematic.

As an alternative to the use of thermal grease, it is possible to use a thermal interface material in the form of an attachable foil. A disadvantage of such an approach is the high price and additional assembly effort in relation to the thermal conductivity performance, and a pronounced thermal contact resistance of the thermal interface material with regard to the die carrier and the heat dissipation body.

A further alternative for TIM are materials based on silicone based materials. They exhibit outstanding thermal conductivity as they fit snugly in the gap between the electrical carrier and the heatsink. However, they have also turned out to be sensitive to scratches during handling. Preventing this sort of damage could make it easier to introduce this technology into a wider variety of applications. The handling impact, e.g. scratches, can lead to lower break down performance with the application.

SUMMARY

Until today no TIM material is known which a) enables safe handling at room temperature while b) allowing for a certain softness and conformity at operating temperatures. For this and other reasons a need exists for the present disclosure.

A first aspect of the present disclosure is related to a semiconductor device package comprising an electrically conductive carrier, a semiconductor die disposed on the carrier, an encapsulant encapsulating part of the carrier and the semiconductor die, an electrically insulating and thermally conductive interface structure, in particular covering an exposed surface portion of the carrier and a connected surface portion of the encapsulant, wherein the interface structure comprises a glass transition temperature in a range between −40° C. to 150° C., more specifically the lower bound of the range being −30° C., −20° C., −10° C., 0° C., 10° C., or 20° C., or 30° C., more specifically the upper bound of the range being 140° C., 130° C., 120° C., 110° C., 100° C., 90° C., 80° C., 70° C., 60° C., 50° C., or 40° C.

A second aspect of the present disclosure is related to a method of fabricating a semiconductor device package, the method comprising mounting a semiconductor die on an electrically conductive carrier, encapsulating part of the carrier and the semiconductor die by an encapsulant, forming an electrically insulating and thermally conductive interface structure, in particular to cover an exposed surface portion of the carrier and a connected surface portion of the encapsulant, comprising a glass transition temperature in a range between −40° C. to 150° C., more specifically the lower bound of the range being −30° C., −20° C., −10° C., 0° C., 10° C., 20° C., or 30° C., more specifically the upper bound of the range being 140° C., 130° C., 120° C., 110° C., 100° C., 90° C., 80° C., 70° C., 60° C., 50° C., or 40° C.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DESCRIPTION OF EMBODIMENTS

Figure 1:
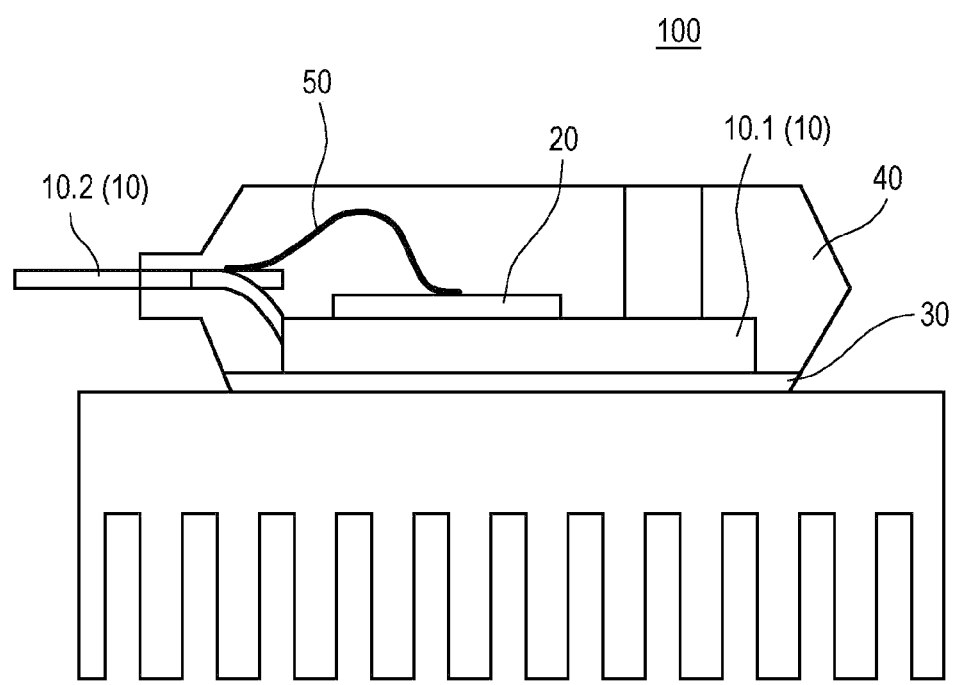
FIG. 1 shows a schematic cross-sectional side view representation of a semiconductor device package of the first aspect according to an example.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

DETAILED DESCRIPTION

According to an exemplary embodiment, a semiconductor device package is provided which comprises an electrically conductive carrier, a semiconductor die disposed on the carrier, an encapsulant encapsulating part of the carrier and the semiconductor die, and an electrically insulating and thermally conductive interface structure covering an exposed surface portion of the carrier and a connected surface portion of the encapsulant, and for example to be attached at an external surface to a heat dissipation body, wherein the interface structure is made of a material having an epoxy resin matrix filled with filler particles, e.g. for instance comprising or consisting of AlO, $ZrO_2$, $Si_3N_4$, BN, AlN, diamond, etc., in particular metal oxide or metal nitride filler particles, with a mass percentage in a range between 75% and 98%, in particular in a range between 83% and 96%, more particularly in a range between 90% and 95%.

According to another exemplary embodiment, a method of fabricating a semiconductor device package is provided, wherein the method comprises mounting a semiconductor die on an electrically conductive carrier, encapsulating part of the carrier and the semiconductor die by an encapsulant, and forming, e.g. for instance encapsulating, an electrically insulating and thermally conductive interface structure, e.g. for example to cover an exposed surface portion of the carrier and a connected surface portion of the encapsulant, and for example to be attached at an external surface to a heat dissipation body, wherein the interface structure is made of a material having an epoxy resin matrix filled with filler particles, e.g. comprising or consisting of AlO, $ZrO_2$, $Si_3N_4$, BN, AlN, diamond, etc., in particular metal oxide and/or metal nitride filler particles, with a mass percentage in a range between 75% and 98%, in particular in a range between 90% and 95%.

According to yet another exemplary embodiment, an semiconductor device package is provided which comprises an electrically conductive carrier which comprises a plurality of galvanically insulated separate carrier regions, in particular a plurality of carrier regions being provided separately from one another and being mutually spaced so as to form mutually galvanically insulated islands, a plurality of semiconductor dies each of which being mounted on a respective one of the carrier regions, an encapsulant encapsulating part of the carrier and the semiconductor dies, and a common electrically insulating and thermally conductive interface structure, in particular a continuous or an integral structure spatially extending beyond the multiple carrier regions and assigned semiconductor dies, covering an exposed surface portion of the carrier regions and a connected surface portion of the encapsulant.

According to yet another exemplary embodiment, a method of fabricating a semiconductor device package is provided, wherein the method comprises mounting each of a plurality of semiconductor dies on a respective one of a plurality of galvanically insulated separate carrier regions of an electrically conductive carrier, encapsulating part of the carrier and the electronic dies by an encapsulant, and forming a common electrically insulating and thermally conductive interface structure covering an exposed surface portion of the carrier regions and a connected surface portion of the encapsulant.

According to yet another exemplary embodiment, an interface material having the above-mentioned features is used for providing an electric isolation and a thermal coupling between a die carrier of a semiconductor device package and a heat dissipation body or cooling unit.

According to an exemplary embodiment of the disclosure, a thermal interface material with a specified range of the glass transition temperature Tg is provided. A thermal interface material with this property can comprise a sufficient hardness and scratch resistance at room temperature in terms of handling and mounting and also a sufficient softness and compressibility at operating temperatures above 60° C. More specifically, a thermal interface material can be selected which has a Tg value between room temperature and the operating temperature such that handling and mounting of the semiconductor device package on the customer's side may be done with a TIM layer of very high hardness and scratch resistance and operating the semiconductor device package may be done with a TIM layer of high softness and compressibility and low modulus.

In particular when the interface structure has a modulus (in particular under adiabatic or under isothermal conditions) within the below defined ranges, a sufficiently soft and sufficiently stable interface structure is obtained which has the mechanical softness of filling gaps to improve thermal coupling and provides the mechanical rigidity for reliably ensuring electric insulation even in the presence of scratch or delamination forces. For the given modulus ranges, a desired high softness is obtained. As a consequence of this softness, the thermal interface material is capable of filling substantially any microgaps at a surface of a heat dissipation body, thereby improving the external thermal coupling. When the thermal interface material on the package is therefore pressed against the heat dissipation body, no or at least no major thermal gaps in form of microscopic air volumes occur. On the other hand, a too soft property is avoided which might have an undesired impact on the electrical reliability and a delamination danger of the thermal interface material. At the same time, a robust (in terms of handling and mounting) and scratch resistant solution is provided. With appropriate compressibility values, it can be achieved that the material of the thermal interface structure properly adapts itself to the material of the heat sink.

The above-mentioned technical advantages may be in particular obtained by configuring the thermal interface material from an epoxy resin matrix in which a sufficiently large amount of properly thermally conductive and electrically insulating filler particles (for instance of metal oxide and/or metal nitride, in particular of at least one of the group consisting of $ZrO_2$, $Si_3N_4$, BN, AlN, diamond, etc.) are embedded.

Advantageously, a single common thermal interface structure (for instance a common thermal interface layer) may cover a plurality of mutually galvanically insulated carrier regions, wherein each of the carrier regions carries a respective one of multiple electronic dies. This allows to process the multiple commonly encapsulated electronic dies on the mutually electrically decoupled die carrier regions altogether on the backside of the package or electronic component in terms of formation of a common thermal interface structure. More specifically, forming the thermal interface structure for the multiple die carrier regions may be performed in one single common procedure, and thus very efficiently.

As an alternative to the attachment of the thermal interface structure with the described advantageous characteristics onto a carrier (and optionally additionally onto an encapsulant) of an electronic component, which is to be attached, in turn, to a heat dissipation body, it is also possible to firmly attach the interface structure onto a heat dissipation body. Such a heat dissipation body with the attached thermal interface structure thereon may then be attached onto an exposed surface portion of a carrier of an electronic component which itself does not have a thermal interface structure on the exposed surface of its carrier.

In an embodiment, the interface structure has at a temperature of 22° C. a hardness in a range between 50 Mpa and 500 Mpa, more specifically the lower bound of the range being 60 Mpa, 70 Mpa, 80 Mpa, 90 Mpa, or 100 Mpa, more specifically the upper bound of the range being 450 Mpa, 400 Mpa, 350 Mpa, 300 Mpa, 250 Mpa, 200 Mpa, 150 Mpa, or 100 Mpa, and at a temperature of 100° C. a hardness in a range between 10 Mpa and 100 Mpa, more specifically the lower bound of the range being 20 Mpa, 30 Mpa, 40 Mpa, or 50 Mpa, more specifically the upper bound of the range being 90 Mpa, 80 Mpa, 70 Mpa, or 60 Mpa.

In the context of the present application, the term "hardness", also named "Vickers hardness", may particularly denote a standardized microhardness of the material of the thermal interface structure. For this purpose, an indenter in form of a pyramid-shaped diamond body may be pressed with a defined force against a surface of the thermal interface material and the resulting protrusion or displacement depth is measured. For measuring the hardness, the indenter may be embodied as a diamond in the form of a square-based pyramid which results in an indenter shape being capable of producing geometrically similar impressions irrespective of size, in an impression which has well-defined points of measurement, and in an indenter which has high resistance to self-deformation. The Vickers hardness (HV number) can then be determined by the ratio F/A, wherein F is the force applied to the diamond and A is the surface area of the resulting indentation.

In an embodiment, the interface structure comprises at a temperature of 22° C. a Young's modulus in a range between 1 Gpa and 30 Gpa, more specifically the lower bound of the range being 2 Gpa, 3 Gpa, 4 Gpa, 5 Gpa, 6 Gpa, 7 Gpa, 8 Gpa, 9 Gpa, or 10 Gpa, more specifically the upper bound of the range being 28 Gpa, 26 Gpa, 24 Gpa, 22 Gpa, 20 Gpa, 18 Gpa, 16 Gpa, 14 Gpa, 12 Gpa, or 10 Gpa, and at a temperature of 100° C. a Young's modulus in a range between 0.1 Gpa and 5 Gpa, more specifically the lower bound of the range being 0.2 Gpa, 0.3 Gpa, 0.4 Gpa, 0.5 Gpa, 0.6 Gpa, 0.7 Gpa, 0.8 Gpa, 0.9 Gpa, or 1.0 Gpa, more specifically the upper bound of the range being 4.5 Gpa, 4.0 Gpa, 3.5 Gpa, 3.0 Gpa, 2.5 Gpa, 2.0 Gpa, 1.5 Gpa, or 1.0 Gpa.

The Young modulus, also denoted as the tensile modulus, is a mechanical property of linear elastic solid materials and indicates the force (per unit area) that is needed to stretch (or compress) a material sample. In the given range of values of the Young modulus, the thermal interface material is sufficiently soft for providing for a smooth and gap-free contact with a heat dissipation body. However, compressibility of the thermal interface material is not exaggerated in this range which maintains the desired electrical and mechanical properties during operation.

In an embodiment, the interface structure comprises a thickness in a range between 50 μm and 1000 μm, more specifically the lower bound of the range being 60 μm, 70 μm, 80 μm, 90 μm, or 100 μm, more specifically the upper bound of the range being 900 μm, 800 μm, 700 μm, 600 μm, 500 μm, 400 μm, 300 μm, or 200 μm. For example, the thickness may be around 250 μm. Sufficiently high thicknesses of the thermal interface material allow for a reliable dielectric or electrically insulating separation between the carrier in an interior of the package and an exterior thereof. However, the thicker the thermal interface material, the stronger will the thermal energy removal capability of the thermal interface structure be influenced. The given range allows to obtain both proper thermal conditions and electrical conditions at the same time. Also a scratch resistance may be ensured with the mentioned thicknesses even under harsh conditions.

In an embodiment, the interface structure has a thermal conductivity of at least 1 $Wm^{-1} K^{-1}$, in particular of at least 2 $Wm^{-1} K^{-1}$, more particularly in a range between 3 $Wm^{-1}K^{-1}$ and 25 $Wm^{-1} K^{-1}$. The thermal interface material shall be properly electrically insulating and thermally conductive at the same time. To obtain this, the physical boundary conditions are challenging. However, it has turned out that the mentioned values of thermal conductivity are on the one hand higher than those of typical encapsulants (such as a mold compound) so that the thermal interface material efficiently removes heat from the package, and also allow to provide the thermal interface material with sufficient dielectric properties.

In an embodiment, the interface structure consists of a single layer. Therefore, it is dispensable to provide complex layer stacks of multiple layers for meeting the various thermomechanical and electrical properties at the same time. A single layer has turned out to be sufficient. This also reduces the effort for forming the thermal interface structure.

In an embodiment, the thermal interface structure may comprise a polymer, in particular a polymer matrix. The polymer matrix may e.g. comprise or consist of an epoxy material. It is also possible to configure the matrix from a polymer mixture of silicone and epoxy material. Furthermore, it is possible to use polyimide and/or polyacrylate and/or cyanate ester and/or BMI (Bis-Maleimides) and/or Novolac and/or amine as matrix material. In an advantageous embodiment, a thermoplastic material may be used as matrix material. Such a thermoplast may provide a high softness in particular at high temperatures allowing the interface material to adjust itself to a contact surface in particular at high temperature values. The various materials mentioned as examples for the matrix may also be combined to form a multi material matrix.

In an embodiment, the filler particles comprise or consist of at least one of the group consisting of aluminum oxide, silicon oxide, boron nitride, zirconium oxide, silicon nitride, diamond and aluminum nitride. Any kind of mixture or combination between these and other filler particles is possible. With the mentioned materials for the filler particles, for instance microscopic spheres or beads, in particular thermal conductivity and dielectric behaviour may be promoted. Optionally, it is possible to include one or more further additives as or to the filler particles. Examples are silicone particles, silicone oil, thermoplastic material particles, carbon black, etc. Such additives may be added to adjust one or more physical parameters, for instance to reduce the Young modulus. Moreover, it is possible to adjust to the surface properties of the filler particles (for instance by coating, for example with a silane coating to improve adhesion which, in turn, has a positive impact on the capability of removing heat). By such a surface treatment, one or more physical properties of the interface material may be tuned (such as moisture protection, adhesion promotion, improvement of the thermal conductivity, etc.).

In an embodiment, a mass percentage of the filler particles is at least 80%, in particular at least 90%. Thus, it has turned out that already very small percentages of matrix material, for instance silicone or epoxy-based materials, are sufficient to provide the desired softness. The large majority of the thermal interface material may therefore be formed by the filler particles by which the various requirements in terms of thermal, electrical and mechanical properties can be freely adjusted.

In an embodiment, the thermal interface structure is made of a material which is a ceramic compound, for instance aluminium oxide particles in a silicone grid.

In an embodiment, the semiconductor device package is configured as one out of the group consisting of a leadframe connected power module, a Transistor Outline (TO) electronic component, a Quad Flat No Leads Package (QFN) package, a Small Outline (SO) package, a Small Outline Transistor (SOT) package, and a Thin Small Outline Package (TSOP) package. Therefore, the package according to an exemplary embodiment is fully compatible with standard packaging concepts (in particular fully compatible with standard TO packaging concepts) and appears externally as a conventional package, which is highly user-convenient. In an embodiment, the package is configured as a power module, for instance molded power module. For instance, an exemplary embodiment of the package may be an intelligent power module (IPM). Another exemplary embodiment of the package is a dual inline package (DIP).

In an embodiment, the interface structure extends over an entire main surface of the encapsulant and over the entire exposed surface portion of the carrier at a main surface of the electronic component. In other words, one entire main surface of the package may be coated with the thermal interface material. This can be a result of the manufacturing procedure of the thermal interface material which is preferably not based on the attachment of a thermal interface foil to the package, but in contrast to this, an integral formation of the thermal interface material by molding or lamination is performed. Furthermore, such a full coating of one entire surface of the package with a thermal interface structure further improves the mechanical robustness and the suppression of the danger of undesired creeping currents between an interior and an exterior of the package. Thus, it is advantageous according to an exemplary embodiment of the disclosure that the size of the thermal interface structure fits exactly to a size of the package. Preferably, the outline of the thermal interface structure and of one main surface of the package are identical. However, since a clamping area requires a certain space, the thermal interface layer may be also smaller than the package area in a fan-in structure.

In an embodiment, the carrier comprises a plurality of sections of different thickness. This increases the design flexibility in terms of electrical and mechanical properties of different sections of the carrier. Alternatively, it is possible that the carrier has a homogeneous thickness over its entire extension.

In an embodiment, the interface structure is formed (in particular encapsulated) by at least one of the group consisting of molding, in particular compression molding or transfer molding, stencil printing, and laminating. Thus, such manufacturing methods may promote the formation of an integral thermal interface which may also intermingle with carrier and/or encapsulant It is alternatively possible to manufacture the interface structure with a generative or an additive (for instance software controlled) manufacturing procedure such as printing, in particular three-dimensional printing. The mentioned manufacturing procedures are therefore preferred over the attachment of a thermal interface foil on the remainder of the package. By molding or laminating, the thermal interface structure may be connected to the remainder of the package by the application of pressure and heat, optionally under vacuum, preferably accompanied by a curing reaction.

In an embodiment, the interface structure is connected to the exposed surface portion of the carrier and to the connected surface portion of the encapsulant by chemically modifying the material of the interface structure, in particular by at least one of the group consisting of crosslinking and melting or any chemical reaction. The integral character of thermal interface material with carrier and/or encapsulant may be further promoted by a chemical reaction initiating the formation of the thermal interface structure.

The thermal interface structure according to an exemplary embodiment of the disclosure is easy to use and provides a plug-and-play package, since no further material (such as unreliable thermal grease and/or paste) is required between the package and the heat sink. Since the handling of thermal grease is dispensable according to exemplary embodiments of the disclosure, there remains no danger that a customer unintentionally influences performance of the electronic device by an unskilled handling of the thermally grease.

Thermal conductivity of the material of the interface structure may be higher than thermal conductivity of the material of the encapsulant. For instance, thermal conductivity of the material of the encapsulant may be in a range between 0.8 Wm$^{-1}$ K$^{-1}$ and 8 Wm$^{-1}$ K$^{-1}$, in particular in a range between 2 Wm$^{-1}$ K$^{-1}$ and 4 Wm$^{-1}$ K$^{-1}$. For example, the material of the interface structure may be an epoxy resin based material (or may be made on the basis of any other resin-based material, and/or combinations thereof) which may comprise filler particles for improving thermal conductivity. For example, such filler particles may comprise or consist of aluminum oxide (and/or boron nitride, aluminum nitride, diamond, silicon nitride). For materials comprising or consisting of zirconium oxide, boron nitride, silicon nitride, diamond, etc., values of 15 Wm$^{-1}$ K$^{-1}$, may be obtained, possibly values in a range between 20 Wm$^{-1}$ K$^{-1}$ and 30 Wm$^{-1}$ K$^{-1}$.

In an embodiment, the carrier comprises or consists of a leadframe. A leadframe may be a metal structure inside a die package that is configured for carrying signals from the electronic die to the outside, and/or vice versa. The electronic die inside the package or electronic component may be attached to the leadframe, and then bond wires may be provided for attach pads of the electronic die to leads of the leadframe. Subsequently, the leadframe may be moulded in a plastic case or any other encapsulant. Outside of the leadframe, a corresponding portion of the leadframe may be cut-off, thereby separating the respective leads. Before such a cut-off, other procedures such a plating, final testing, packing, etc. may be carried out, as known by those skilled in the art. Leadframe or die carrier can be coated before encapsulation, for instance by an adhesion promoter.

In an embodiment, the semiconductor device package further comprises the above-mentioned heat dissipation body attached or to be attached to the interface structure for dissipating heat generated by the electronic die during operation of the package. For example, the heat dissipation body may be a plate of a properly thermally conductive body, such as copper or aluminium or graphite, diamond, composite material and/or combinations of the mentioned and/or other materials, which may have cooling fins or the like to further promote dissipation of heat which can be thermally conducted from the electronic die via the die carrier and the interface structure to the heat dissipation body. The removal of the heat via the heat dissipation body may further be promoted by a cooling fluid such as air or water (more generally a gas and/or a liquid) which may flow along the heat dissipation body externally of the electronic component. Also heat pipes may be implemented.

In an embodiment, the semiconductor device package is adapted for double-sided cooling. For example, a first interface structure may thermally couple the encapsulated die and carrier with a first heat dissipation body, whereas a second interface structure may thermally couple the encapsulated die and carrier with a second heat dissipation body.

In an embodiment, the semiconductor die is configured as a power semiconductor die. Thus, the semiconductor die (such as a semiconductor die) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power die may comprise one or more field effect transistors, diodes, inverter circuits, half-bridges, full-bridges, drivers, logic circuits, further devices, etc.

In an embodiment, the semiconductor die experiences a vertical current flow. The package architecture according to exemplary embodiments of the disclosure is particularly appropriate for high power applications in which a vertical current flow is desired, i.e. a current flow in a direction perpendicular to the two opposing main surfaces of the electronic die, one of which being used for mounting the semiconductor die on the carrier.

As substrate or wafer forming the basis of the semiconductor dies, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SIC technology.

The above and other objects, features and advantages will become apparent from the following description and the appended claims, taken in conjunction with the accompanying drawings, in which like parts or elements are denoted by like reference numbers.

FIG. 1 shows a schematic cross-sectional side view representation of a semiconductor device package of the first aspect according to an example.

The semiconductor device package 100 of FIG. 1 comprises electrically conductive carrier 10, a semiconductor die 20 disposed on the carrier 10, an encapsulant 40 encapsulating part of the carrier 10 and the semiconductor die 20, an electrically insulating and thermally conductive interface structure 30, covering an exposed surface portion of the carrier 10 and a connected surface portion of the encapsulant 40, wherein the interface structure 30 is made of an epoxy resin material and comprises a glass transition temperature of about 35° C.

Furthermore the resin matrix of the interface structure 30 is filled with filler particles made of aluminum oxide, wherein the mass percentage of the filler particles in the epoxy resin material is about 95%.

In the embodiment as shown in FIG. 1, the carrier 10 is a leadframe 10 which comprises a die pad 10.1 for mounting the semiconductor die 20 thereon and a plurality of external leads 10.2 at least one of which is connected with an upper contact pad of the semiconductor die 20 by a bond wire 50. The semiconductor die 20 is an IGBT die and the semiconductor device package 100 is a TO package.

Within the disclosure of this application the semiconductor device package 100 can be mounted on a heatsink 60. In the present embodiment the heatsink 60 is made of an aluminum block comprising a plurality of fins 61 for improving the heat dissipation to the environment.

Figure 2:
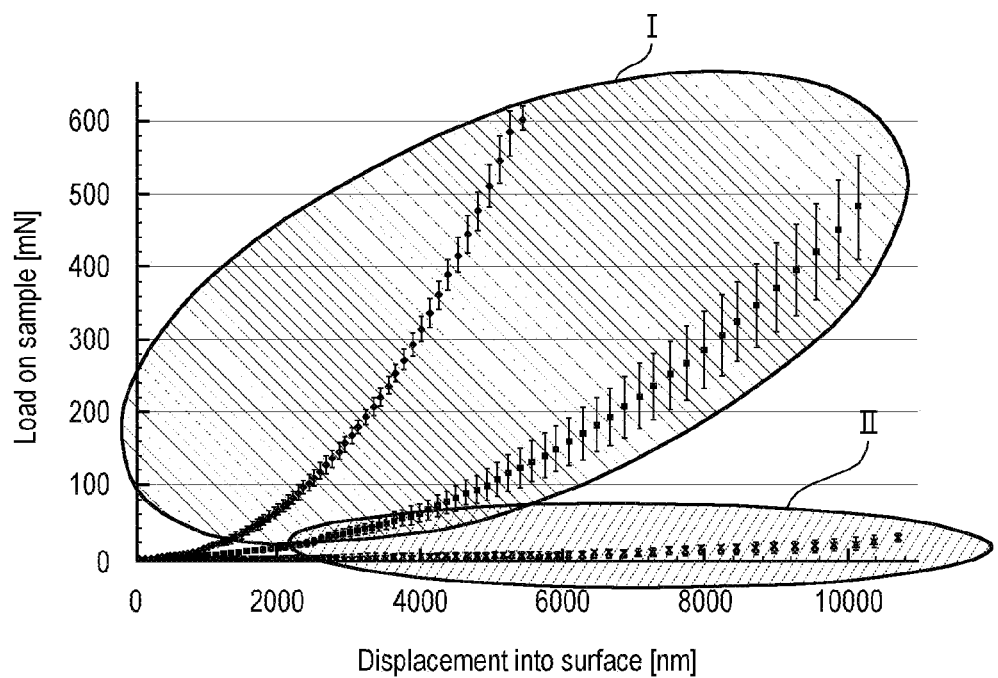
FIG. 2 shows a diagram plotting the measured displacement into the sample surface in dependence on the load on the sample for low Tg epoxy materials according to the disclosure and known silicone materials.

FIG. 2 shows a diagram plotting the measured displacement into the sample surface in dependence on the load on the sample for epoxy materials according to the disclosure and known silicone materials.

The measurements were done as was described before, namely by pressing an indenter in the form of a pyramid-shaped diamond body with a defined force against a surface of the thermal interface material and by measuring the resulting displacement depth. The measurements were done at a temperature T of 22°.

The differently grey shaded areas I and II show the measurement results for a material according to the present disclosure (I) and for previously used silicone-based materials (II). The lower curve of I shows measurements performed with the thermal interface material as was shown and described in connection with FIG. 1 hence at Tg>T. The upper curve of I shows measurements done with a material of a different constitution and Tg=210° C. The curves of II show measurement results of two different silicone materials.

It can clearly be seen that for the previously used silicone materials even very low amounts of load are sufficient to cause significant displacements into the surface of the material. On the other hand the epoxy materials according to the present disclosure show a robust behaviour with rather small displacements at even high load values. These materials are therefore highly advantageous for handling corresponding semiconductor device packages at the customer's side.

Figure 3:
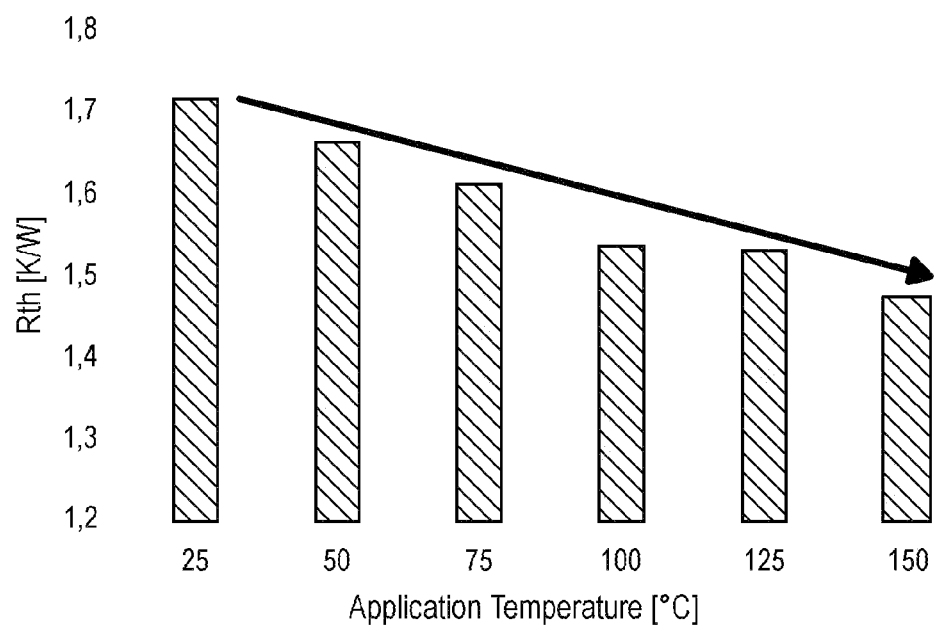
FIG. 3 shows a bar diagram depicting the measured heat resistance between a low Tg epoxy material according to the disclosure and an aluminum heat sink in dependence on the temperature.
Figure 4A:
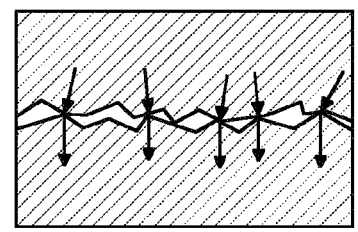
FIG. 4 comprises FIGS. 4A and 4B and schematically illustrates the effect of the temperature on the heat resistance between a low Tg epoxy material and a heat sink.
Figure 4B:
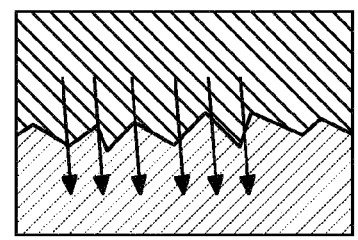

FIG. 3 shows a bar diagram depicting the measured heat resistance Rth between an epoxy material according to the disclosure and an aluminum heat sink in dependence on the temperature and FIG. 4 comprising FIGS. 4A and 4B schematically illustrates the situation at the contact zone between the thermal interface material and the heatsink at different temperatures.

As can be seen in the bar diagram, the values of Rth continuously decrease from a relatively high value of 1.7 K/W at a temperature of 25° C. down to a value of below 1.5 K/W at a temperature of 150° C. This decrease can be explained by a softening of the thermal interface layer and corresponding flowing and creeping of the thermal interface material into hollow spaces and indentations in the surface of the heatsink which leads to an increase of the contact area and a corresponding increase of heat flow.

Figure 5A:
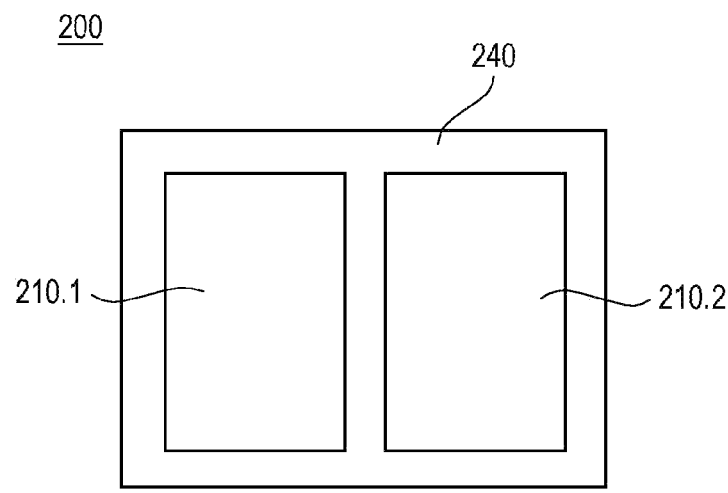
FIG. 5 comprises FIGS. 5A and 5B and shows a down view of an exemplary semiconductor device package comprising two electrically separated carrier regions (5A) which can be covered with a common TIM structure (5B).
Figure 5B:
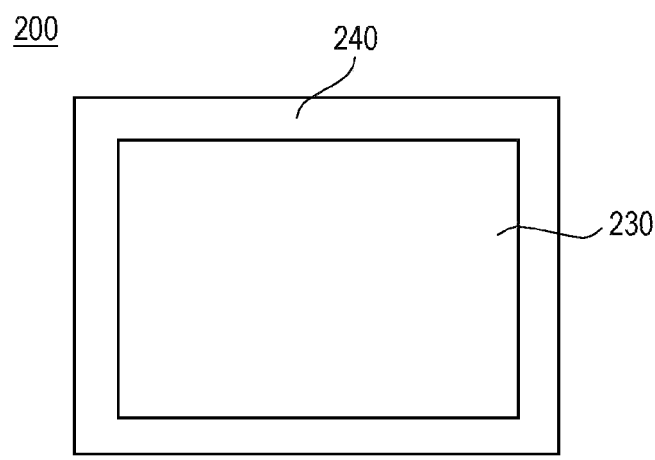

FIG. 5 comprises FIGS. 5A and 5B and shows a down view of an exemplary semiconductor device package comprising two electrically separated carrier regions (5A) which can be covered with a common TIM structure (5B).

The semiconductor device package 200 as shown in FIG. 5 is an example for the above described embodiment in which a semiconductor device package is provided with a plurality of galvanically insulated separate carrier regions, in particular a plurality of carrier regions being provided separately from one another and being mutually spaced so as to form mutually galvanically insulated islands, and a plurality of semiconductor dies each of which being mounted on a respective one of the carrier regions.

FIG. 5A shows the semiconductor device package 200 before applying the thermal interface layer. The semiconductor device package 200 can, for example, be a package comprising an IGBT die on a first die pad 210.1, and a diode die on a second die pad 210.2, wherein the diode can be electrically connected in parallel to the IGBT. The first and second die pads 210.1, 210.2 may be mounted on a common lead frame and galvanically isolated from each other.

FIG. 5B shows the semiconductor device package 200 after applying the thermal interface layer 230. As can be seen, it is not necessary to provide separate thermal interface layers for the rear surfaces of each one of the die pads. Instead one can apply one single homogeneous thermal interface layer 230 covering the rear surfaces of all die pads of the packages.

Figure 6:
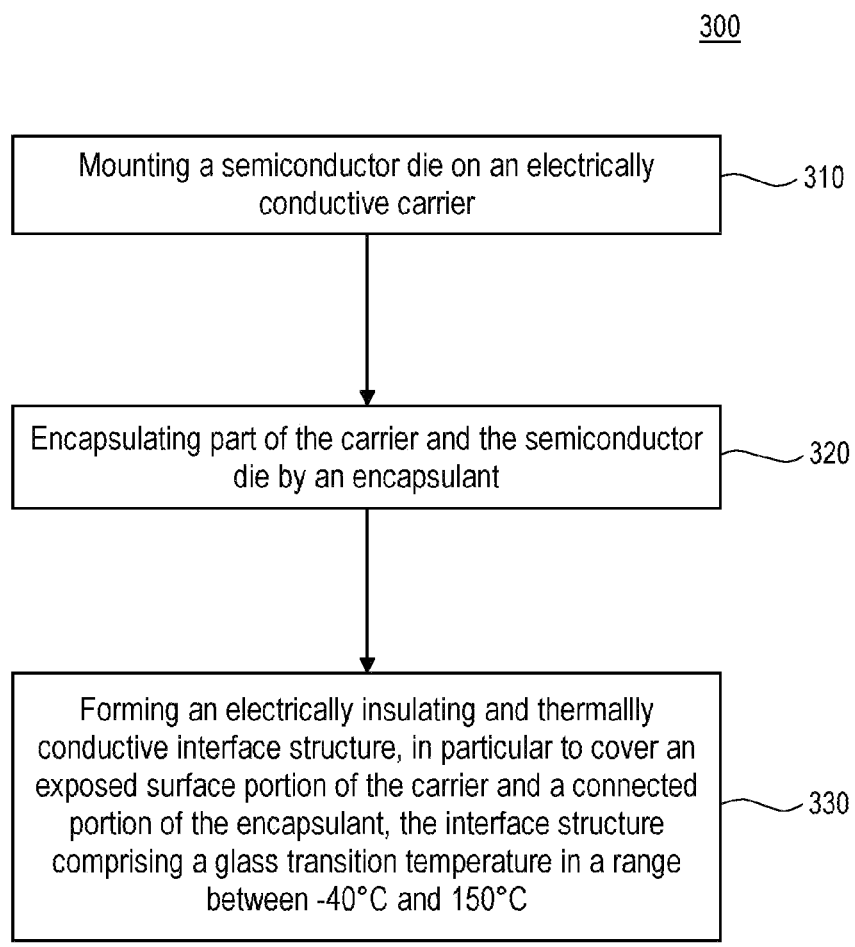
FIG. 6 shows a flow diagram for illustrating a method for fabricating a semiconductor device package according to the second aspect.

FIG. 6 shows a flow diagram for illustrating a method for fabricating a semiconductor device package according to the second aspect.

The method 330 of FIG. 6 comprises mounting a semiconductor die on an electrically conductive carrier (310), encapsulating part of the carrier and the semiconductor die by an encapsulant (320), and forming an electrically insulating and thermally conductive interface structure, in particular to cover an exposed surface portion of the carrier and a connected surface portion of the encapsulant, the interface structure comprising a glass transition temperature Tg in a range between −40° C. to 150° C. (330).

More specifically the lower bound of the range of the temperature Tg can also be −30° C., −20° C., −10° C., 0° C., 10° C., 20° C., or 30° C., and more specifically the upper bound of the range can also be 140° C., 130° C., 120° C., 110° C., 100° C., 90° C., 80° C., 70° C., 60° C., 50° C., or 40° C.

Further embodiments of the method can be formed by including further features which were described above in connection with the semiconductor device package according to the first aspect.

Example 1 is a semiconductor device package comprising an electrically conductive carrier, a semiconductor die disposed on the carrier, an encapsulant encapsulating part of the carrier and the semiconductor die, an electrically insulating and thermally conductive interface structure, in particular covering an exposed surface portion of the carrier and a connected surface portion of the encapsulant, wherein the interface structure (30) comprises a glass transition temperature in a range between −40° C. to 150° C., more specifically the lower bound of the range being −30° C., −20° C., −10° C., 0° C., 10° C., 20° C., or 30° C., more specifically the upper bound of the range being 140° C., 130° C., 120° C., 110° C., 100° C., 90° C., 80° C., 70° C., 60° C., 50° C., or 40° C.

Example 2 is the semiconductor device package according to Example 1, wherein the interface structure comprises a resin material, in particular an epoxy resin material.

Example 3 is the semiconductor device package according to Example 2, wherein the interface structure comprises a resin matrix filled with filler particles, in particular filler particles comprising at least one of the group consisting of metal oxide, metal nitride, aluminum oxide, silicon oxide, boron nitride, zirconium oxide, silicon nitride, diamond, and aluminum nitride.

Example 4 is the semiconductor device package according to Example 3, wherein a mass percentage of the filler particles is in a range between 75% and 98%, more specifically the lower bound of the range being 80%, 85%, 90%, or 95%, more specifically the upper bound of the range being 97%, 96%, or 95%.

Example 5 is the semiconductor device package according to any one of the preceding Examples, wherein the interface structure comprises at a temperature of 22° C. a hardness in a range between 50 Mpa and 500 Mpa, more specifically the lower bound of the range being 60 Mpa, 70 Mpa, 80 Mpa, 90 Mpa, or 100 Mpa, more specifically the upper bound of the range being 450 Mpa, 400 Mpa, 350 Mpa, 300 Mpa, 250 Mpa, 200 Mpa, 150 Mpa, or 100 Mpa.

Example 6 is the semiconductor device package according to any one of the preceding Examples, wherein the interface structure comprises at a temperature of 100° C. a hardness in a range between 10 Mpa and 100 Mpa, more specifically the lower bound of the range being 20 Mpa, 30 Mpa, 40 Mpa, or 50 Mpa, more specifically the upper bound of the range being 90 Mpa, 80 Mpa, 70 Mpa, 60 Mpa, or 50 Mpa.

Example 7 is the semiconductor device package according to any one of the preceding Examples, wherein the interface structure comprises at a temperature of 22° C. a Young's modulus in a range between 1 Mpa and 30 Mpa, more specifically the lower bound of the range being 2 Mpa, 3 Mpa, 4 Mpa, 5 Mpa, 6 Mpa, 7 Mpa, 8 Mpa, 9 Mpa, or 10 Mpa, more specifically the upper bound of the range being 28 Mpa, 26 Mpa, 24 Mpa, 22 Mpa, 20 Mpa, 18 Mpa, 16 Mpa, 14 Mpa, 12 Mpa, or 10 Mpa.

Example 8 is the semiconductor device package according to any one of the preceding Examples, wherein the interface structure comprises at a temperature of 100° C. a Young's modulus in a range between 0.1 Mpa and 5 Mpa, more specifically the lower bound of the range being 0.2 Mpa, 0.3 Mpa, 0.4 Mpa, 0.5 Mpa, 0.6 Mpa, 0.7 Mpa, 0.8 Mpa, 0.9 Mpa, or 1.0 Mpa, more specifically the upper bound of the range being 4.5 Mpa, 4.0 Mpa, 3.5 Mpa, 3.0 Mpa, 2.5 Mpa, 2.0 Mpa, 1.5 Mpa, or 1.0 Mpa.

Example 9 is the semiconductor device package according to any one of the preceding Examples, wherein the interface structure comprises a thickness in a range between 50 μm and 600 μm, more specifically the lower bound of the range being 60 μm, 70 μm, 80 μm, 90 μm, or 100 μm, more specifically the upper bound of the range being 900 μm, 800 μm, 700 μm, 600 μm, 500 μm, 400 μm, 300 μm, or 200 μm.

Example 10 is the semiconductor device package according to any one of the preceding Examples, wherein the carrier is one or more of a portion of a leadframe, a direct copper bond (DCB), an active metal braze (AMB), or and an isolated metal substrate (IMS).

Example 11 is the semiconductor device package according to any one of the preceding Examples, wherein the semiconductor die (20) comprises one or more of a vertical transistor die, a MOSFET die, an IGBT die, a SiC-MOS Die, a Cool-MOS die, an S-FET die, a gate driver die, a controller, or a connectivity die.

Example 12 is the semiconductor device package according to any one of the preceding Examples, wherein the semiconductor device package is one or more of a discrete or standardized package, a discrete or standardized power package, a TO package, a TO220 package, a TO247 package, a TO263 package, a D2PAK package, a top-side cooler package, or an intelligent power module.

Example 13 is a method of manufacturing a semiconductor device package, the method comprising mounting a semiconductor die on an electrically conductive carrier, encapsulating part of the carrier and the semiconductor die by an encapsulant, forming an electrically insulating and thermally conductive interface structure, in particular to cover an exposed surface portion of the carrier and a connected surface portion of the encapsulant, the interface structure comprising a glass transition temperature in a range between −40° C. to 150° C., more specifically the lower bound of the range being −30° C., −20° C., −10° C., 0° C., 10° C., 20° C., or 30° C., more specifically the upper bound of the range being 140° C., 130° C., 120° C., 110° C., 100° C., 90° C., 80° C., 70° C., 60° C., 50° C., or 40° C.

Example 14 is the method according to Example 13, wherein the interface structure comprises a resin material, in particular an epoxy resin material.

Example 15 is the method according to Example 13 or 14, wherein the interface structure comprises a resin matrix filled with filler particles, in particular filler particles comprising at least one of the group consisting of metal oxide, metal nitride, aluminum oxide, silicon oxide, boron nitride, zirconium oxide, silicon nitride, diamond, and aluminum nitride.

Example 16 is the method according to Example 15, wherein a mass percentage of the filler particles is in a range between 75% and 98%, more specifically the lower bound of the range being 80%, 85%, 90%, or 95%, more specifically the upper bound of the range being 97%, 96%, or 95%.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor device package comprising:
an electrically conductive carrier;
a semiconductor die disposed on the carrier;
an encapsulant encapsulating part of the carrier and the semiconductor die;
an electrically insulating and thermally conductive interface structure, covering an exposed surface portion of the carrier and a connected surface portion of the encapsulant;
wherein the interface structure comprises a glass transition temperature in a range between −40° C. to 150° C.,
wherein the interface structure comprises at a temperature of 100° C. a Young's modulus greater than 0.1 Gpa.

2. The semiconductor device package according to claim 1, wherein the interface structure comprises a resin matrix filled with filler particles, the filler particles comprising at least one of the group consisting of metal oxide, metal nitride, aluminum oxide, silicon oxide, boron nitride, zirconium oxide, silicon nitride, diamond, and aluminum nitride.

3. The semiconductor device package according to claim 2, wherein a mass percentage of the filler particles is in a range between 75% and 98%.

4. The semiconductor device package according to claim 1, wherein the interface structure comprises at a temperature of 22° C. a hardness in a range between 50 Mpa and 500 Mpa.

5. The semiconductor device package according to claim 1, wherein the interface structure comprises at a temperature of 100° C. a hardness in a range between 10 Mpa and 100 Mpa.

6. The semiconductor device package according to claim 1, wherein the interface structure comprises at a temperature of 22° C. a Young's modulus of greater than 2 Gpa and less than or equal to 30 Gpa.

7. The semiconductor device package according to claim 1, wherein the interface structure comprises a thickness in a range between 50 μm and 1000 μm.

8. The semiconductor device package according to claim 1, wherein the carrier is one or more of a portion of a leadframe, a direct copper bond (DCB), an active metal braze (AMB), or and an isolated metal substrate (IMS).

9. The semiconductor device package according to claim 1, wherein the semiconductor die comprises one or more of a vertical transistor die, a MOSFET die, an IGBT die, a SiC-MOS Die, a Cool-MOS die, an S-FET die, a gate driver die, a controller, or a connectivity die, or a sensing die.

10. The semiconductor device package according to claim 1, wherein the semiconductor device package is one or more of a discrete or standardized package, a discrete or standardized power package, a TO package, a TO220 package, a TO247 package, a TO263 package, a D2PAK package, a top-side cooler package, a power module, or an intelligent power module.

11. The semiconductor device package according to claim 1, wherein the glass transition temperature is in a range of about 20° C. and 150° C.

12. A method of manufacturing a semiconductor device package, the method comprising:
   mounting a semiconductor die on an electrically conductive carrier,
   encapsulating part of the carrier and the semiconductor die by an encapsulant; forming an electrically insulating and thermally conductive interface structure, to cover an exposed surface portion of the carrier and a connected surface portion of the encapsulant, the interface structure comprising a glass transition temperature in a range between −40° C. to 150° C.,
   wherein the interface structure comprises at a temperature of 100° C. a Young's modulus greater than 0.1 Gpa.

13. The method according to claim 12, wherein the interface structure comprises a resin matrix filled with filler particles, the filler particles comprising at least one of the group consisting of metal oxide, metal nitride, aluminum oxide, silicon oxide, boron nitride, zirconium oxide, silicon nitride, diamond, and aluminum nitride.

14. The method according to claim 13, wherein
   a mass percentage of the filler particles is in a range between 75% and 98%.

15. The method according to claim 12, wherein the glass transition temperature is in a range of about 20° C. and 150° C.

16. The method according to claim 12, wherein the interface structure comprises at a temperature of 22° C. a Young's modulus of greater than 2 Gpa and less than or equal to 30 Gpa.

* * * * *